(12) United States Patent
Sampath et al.

(10) Patent No.: US 8,778,081 B2
(45) Date of Patent: Jul. 15, 2014

(54) PROCESS AND HARDWARE FOR DEPOSITION OF COMPLEX THIN-FILM ALLOYS OVER LARGE AREAS

(71) Applicant: Colorado State University Research Foundation, Fort Collins, CO (US)

(72) Inventors: Walajabad S. Sampath, Fort Collins, CO (US); Pavel S. Kobyakov, Fort Collins, CO (US); Kevin E. Walters, Milliken, CO (US); Davis R. Hemenway, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 0 days.

(21) Appl. No.: 13/733,716

(22) Filed: Jan. 3, 2013

(65) Prior Publication Data

US 2013/0183793 A1    Jul. 18, 2013

Related U.S. Application Data

(60) Provisional application No. 61/582,900, filed on Jan. 4, 2012.

(51) Int. Cl.
  *C23C 16/00*   (2006.01)
  *C23C 14/24*   (2006.01)
  *H01L 21/00*   (2006.01)
  *H01L 21/44*   (2006.01)
  *H01L 31/18*   (2006.01)

(52) U.S. Cl.
  CPC ........... *C23C 14/243* (2013.01); *H01L 31/1828* (2013.01)
  USPC ............. 118/726; 438/679; 438/95; 118/725; 427/248.1; 427/250

(58) Field of Classification Search
  CPC .... C23C 14/24; C23C 14/243; H01L 31/1828
  USPC ...................... 438/48, 95, 584, 758, 679, 971; 118/724–726, 715; 427/248.1, 593, 427/250, 96.8, 76
  See application file for complete search history.

(56) References Cited

U.S. PATENT DOCUMENTS

| 2,405,662 A | * | 8/1946 | McManus et al. | 204/192.32 |
| 4,058,430 A | * | 11/1977 | Suntola et al. | 427/255.13 |
| 4,154,631 A | * | 5/1979 | Schoolar | 117/105 |
| 4,161,418 A | * | 7/1979 | Morimoto et al. | 438/507 |
| 4,281,029 A | * | 7/1981 | Takagi et al. | 427/523 |
| 4,401,052 A | * | 8/1983 | Baron et al. | 118/718 |
| 4,668,480 A | * | 5/1987 | Fujiyashu et al. | 118/719 |
| 5,002,837 A | * | 3/1991 | Shimogori et al. | 428/621 |

(Continued)

OTHER PUBLICATIONS

U.S. Appl. No. 13/526,383 Office Action mailed Jun. 12, 2013 (13 pages).

(Continued)

*Primary Examiner* — Mary Wilczewski
*Assistant Examiner* — Erik T Peterson
(74) *Attorney, Agent, or Firm* — Polsinelli PC

(57) ABSTRACT

Systems and methods for depositing complex thin-film alloys on substrates are provided. In particular, systems and methods for the deposition of thin-film $Cd_{1-x}M_xTe$ ternary alloys on substrates using a stacked-source sublimation system are provided, where M is a metal such as Mg, Zn, Mn, and Cu.

11 Claims, 8 Drawing Sheets

(56) References Cited

U.S. PATENT DOCUMENTS

| | | | |
|---|---|---|---|
| 5,674,813 A * | 10/1997 | Nakamura et al. | 505/473 |
| 6,210,755 B1 * | 4/2001 | Fuchs et al. | 427/255.34 |
| 6,248,399 B1 * | 6/2001 | Hehmann | 427/248.1 |
| 6,273,957 B1 * | 8/2001 | Yamamuka et al. | 118/724 |
| 6,444,043 B1 * | 9/2002 | Gegenwart et al. | 118/726 |
| 6,770,562 B2 * | 8/2004 | Yamazaki et al. | 438/679 |
| 7,481,889 B2 * | 1/2009 | Yamazaki et al. | 118/726 |
| 7,482,631 B2 * | 1/2009 | Yamazaki et al. | 438/679 |
| 7,611,587 B2 * | 11/2009 | Chow et al. | 118/726 |
| 8,211,233 B2 * | 7/2012 | Yoon et al. | 118/727 |
| 8,278,135 B2 * | 10/2012 | Yamazaki et al. | 438/99 |
| 8,481,120 B2 * | 7/2013 | Choquet et al. | 427/251 |
| 2004/0163600 A1 | 8/2004 | Hoffmann et al. | |
| 2005/0072361 A1 * | 4/2005 | Yang et al. | 118/726 |
| 2006/0045958 A1 * | 3/2006 | Abiko et al. | 427/66 |
| 2008/0014822 A1 * | 1/2008 | Yamazaki et al. | 445/24 |
| 2010/0055826 A1 * | 3/2010 | Zhong et al. | 438/84 |
| 2010/0104752 A1 * | 4/2010 | Choquet et al. | 427/250 |
| 2010/0184249 A1 * | 7/2010 | Chen | 438/72 |
| 2010/0243056 A1 * | 9/2010 | Korevaar et al. | 136/260 |
| 2010/0247809 A1 * | 9/2010 | Neal | 427/596 |
| 2011/0104398 A1 * | 5/2011 | Korevaar et al. | 427/561 |
| 2011/0143489 A1 | 6/2011 | Korevaar | |
| 2011/0204355 A1 | 8/2011 | Suzuki et al. | |
| 2011/0239940 A1 * | 10/2011 | Benvenuti et al. | 118/715 |
| 2012/0006809 A1 * | 1/2012 | Kobyakov et al. | 219/542 |
| 2012/0040516 A1 * | 2/2012 | Xia | 438/478 |
| 2012/0103261 A1 * | 5/2012 | Johnson et al. | 118/726 |
| 2012/0244282 A1 * | 9/2012 | Faber et al. | 427/255.5 |
| 2012/0260855 A1 * | 10/2012 | Cho et al. | 118/696 |
| 2012/0322198 A1 * | 12/2012 | Kobyakov et al. | 438/95 |

OTHER PUBLICATIONS

Dhere et al; "Fabrication and Characterization of $Cd_{1-x}Mg_xTe$ Thin Films and Their Application in Solar Cells"; Mater. Res. Soc. Symp. Proc.; vol. 1012 ©; 2007 Materials Research Society.

* cited by examiner

PROCESS AND HARDWARE FOR DEPOSITION OF COMPLEX THIN-FILM ALLOYS OVER LARGE AREAS

GOVERNMENTAL RIGHTS IN THE INVENTION

This invention was made with government support under Grant Nos. IIP0968987 and IIP1127362 awarded by the National Science Foundation. The government has certain rights in the invention.

CROSS REFERENCE TO RELATED APPLICATIONS

This application claims the benefit of U.S. Provisional Patent Application No. 61/582,900 filed Jan. 4, 2012 and entitled "Process and Hardware for Deposition of Complex Thin-film Alloys over Large Areas," which is hereby incorporated herein by reference in its entirety.

FIELD OF THE INVENTION

Aspects of the present disclosure relate to systems and methods for the deposition of complex thin-film alloys on substrates. In particular, aspects of the present disclosure relate to systems and methods for the deposition of thin-film $Cd_{1-x}M_xTe$ ternary alloys on substrates, where M is a metal such as Mg, Zn, Mn, or Cu.

BACKGROUND OF THE INVENTION

Despite recent improvement in efficiency, CdS/CdTe heterojunction solar cells perform significantly below the theoretical limit based on the band gap of CdTe. Several design enhancements to improve the efficiency of these solar cells have been proposed, including alternative solar cell designs and the incorporation of additional elements into the existing design of CdS/CdTe solar cells. For example, a tandem junction cell design which incorporates a CdTe-based ternary alloy with a higher band gap as a p-type absorber in the top cell may exhibit higher efficiency. As another example, the efficiency of the existing CdS/CdTe heterojunction solar cell may be enhanced by the inclusion of an electron reflector (ER) structure in the form of a CdTe-based ternary alloy layer. In both cases, the CdTe-based ternary alloy may be a high band gap alloy, such as $Cd_{1-x}Mg_xTe$.

The widespread adoption of these design enhancements of CdS/CdTe heterojunction solar cells may be hampered in part by the lack of methods to produce $Cd_{1-x}Mg_xTe$ layers of sufficient quality on a large scale. Existing methods of $Cd_{1-x}Mg_xTe$ deposition, including RF sputtering and co-evaporation methods such as side-by-side close-source sublimation (CSS) methods, are known to produce good quality $Cd_{1-x}Mg_xTe$ films, but these existing methods are typically slow and demonstrate poor spatial uniformity, rendering these methods unsuitable for use in large scale manufacturing.

A need exists for improved systems and methods for the deposition of high quality $Cd_{1-x}Mg_xTe$ films rapidly, over large areas, and with high spatial uniformity. These improved systems and methods would eliminate a significant barrier to realizing and commercializing the potential efficiency improvements to solar cells described above.

BRIEF SUMMARY OF THE INVENTION

This disclosure presents a novel stacked-source sublimation system for depositing a complex thin-film alloy, including but not limited to a ternary $Cd_{1-x}M_xTe$ thin film on a substrate.

In a first aspect, a stacked-source sublimation system for the deposition of a complex thin-film alloy on a substrate is provided. The system includes a first crucible operatively connected to a first heating element and defining a first heated pocket opening upward at a pocket opening. The system also includes a second crucible operatively connected to a second heating element and defining a second heated pocket opening upward into a manifold. The manifold includes a plurality of conduits that connect the second heated pocket to the first heated pocket. The system further includes the substrate operatively connected to a third heating element situated vertically above the pocket opening.

In a second aspect, a stacked-source sublimation system for the deposition of Cd1-xMgxTe thin-film alloy on a substrate is provided. The system includes a first crucible operatively connected to a first heating element and defining a first heated pocket opening upward at a pocket opening. The first heated pocket contains a first source material consisting of CdTe, and the first heating element maintains the first heated pocket at a first temperature ranging from about 540° C. to about 620° C.

In this second aspect, the system also includes a second crucible connected to a second heating element. The second crucible is situated vertically below the first crucible and defines a second heated pocket opening upward into a manifold that includes a plurality of conduits. The second heated pocket contains a second source material consisting of Mg. The second heating element maintains the second heated pocket at a second temperature ranging from about 350° C. to about 520° C. The plurality of conduits is distributed evenly over a bottom wall of the first heated pocket, and each of the plurality of conduits extends vertically upward to connect the second heated pocket to the first heated pocket through the bottom wall.

Also in this second aspect, the system includes the substrate operatively connected to a third heating element situated vertically above the pocket opening at a vertical separation distance of at least about 1 µm. The third heating element maintains the substrate at a third temperature ranging from about 300° C. to about 550° C.

In a third aspect, a method for the deposition of a complex thin-film alloy on a substrate is provided. The method includes providing a stacked-source sublimation system that includes a first crucible defining a first heated pocket opening upward at a pocket opening and a second crucible operatively connected to a second heating element and defining a second heated pocket opening upward into a manifold comprising a plurality of conduits. The plurality of conduits connects the second heated pocket to the first heated pocket.

In this third aspect, the method further includes situating the substrate vertically above the pocket opening at a vertical separation distance of at least about 1 µm, sublimating a first source material at a first temperature within the first heated pocket to form a first flux, and sublimating a second source material at a second temperature within the second heated pocket to form a second flux. The method also includes transferring the second flux from the second heated pocket to the first heated pocket via the manifold to form a deposition mixture, and contacting the deposition mixture with the substrate to deposit the complex thin-film alloy on the substrate. The substrate is maintained at a third temperature in this additional aspect.

In a fourth aspect, a method for the deposition of a Cd1-xMgxTe thin-film alloy on a substrate is provided. The method includes providing a stacked-source sublimation system that includes a first crucible defining a first heated pocket opening upward at a pocket opening and a second crucible operatively connected to a second heating element and defining a second heated pocket opening upward into a manifold that includes a plurality of conduits. The plurality of conduits connects the second heated pocket to the first heated pocket.

In this fourth aspect, the method also includes situating a substrate vertically above the pocket opening at a vertical separation distance of at least about 1 μm and sublimating a first source material consisting of CdTe within the first heated pocket at a first temperature ranging from about 540° C. to about 620° C. to form a first flux. In addition, the method includes sublimating a second source material consisting of Mg within the second heated pocket at a second temperature ranging from about 350° C. to about 520° C. to form a second flux. This method further includes transferring the second flux from the second heated pocket to the first heated pocket via the manifold to form a deposition mixture and contacting the deposition mixture with the substrate to deposit the complex thin-film alloy on the substrate. The substrate is maintained at a third temperature ranging from about 400° C. to about 550° C.

While multiple embodiments are disclosed, still other embodiments of the present disclosure will become apparent to those skilled in the art from the following detailed description, which shows and describes illustrative embodiments of the disclosure. As will be realized, the devices and methods disclosed herein are capable of modifications in various aspects, all without departing from the spirit and scope of the present disclosure. Accordingly, the drawings and detailed description are to be regarded as illustrative in nature and not restrictive.

BRIEF DESCRIPTION OF THE DRAWINGS

The following figures illustrate various aspects of the technology disclosed herein.

FIG. 6A is a SEM image of a CdTe film (x=0) with a band gap of 1.494. FIG. 6B is a SEM image of a film with x=0.156 and a band gap of 1.789. FIG. 6C is a SEM image of a film with x=0.346 and a band gap of 2.125.

Corresponding reference characters and labels indicate corresponding elements among the views of the drawings. The headings used in the figures should not be interpreted to limit the scope of the claims.

DETAILED DESCRIPTION

Figure 1:
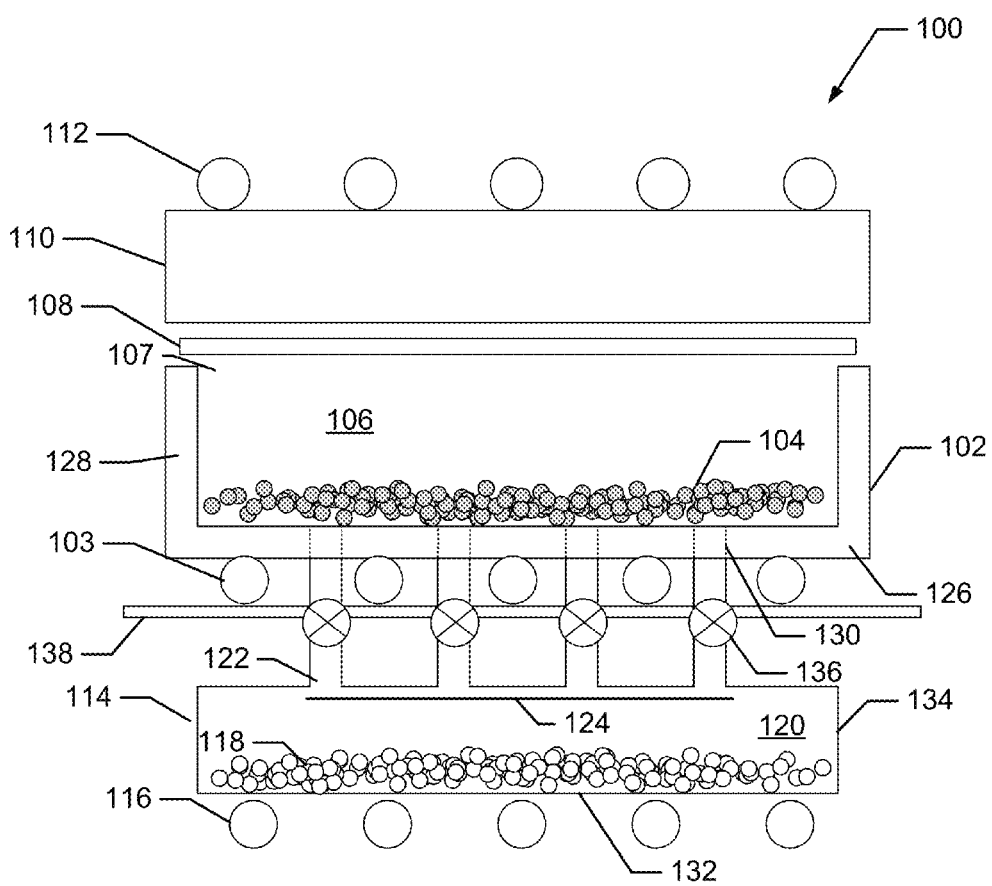
FIG. 1 is a schematic diagram of a stacked-source sublimation system.

Provided herein are systems and methods for the deposition of complex thin-film alloys using a novel stacked-source sublimation system. The design of the stacked-source sublimation system includes at least two thermally independent sublimation sources that are operatively connected using a manifold. The combined fluxes produced by the sublimation sources are mixed and contacted with the substrate, which is also thermally independent.

The sublimation sources of the stacked-source sublimation system may be arranged in any spatial arrangement without limitation including, but not limited to, a side-by-side horizontal arrangement and a vertically aligned arrangement. In one aspect, the stacked-source sublimation system may include a top sublimation source and a bottom sublimation source stacked in a vertically aligned arrangement. In this aspect, the top and bottom sublimation sources may be connected by a manifold that includes one or more conduits through which the bottom flux produced by the bottom sublimation source may be transported to the substrate along with the top flux produced by the top sublimation source. Vapor feed valves or shutters in the one or more conduits may be included to adjust and/or cut off the feed of the bottom flux as desired to implement a variety of complex thin-film alloy layer structures. In addition, the sublimation source temperatures may be manipulated independently to control individual vapor fluxes as well as to control the overall growth rate of the deposited complex thin-film alloy.

The stacked-source sublimation system overcomes many limitations of previous systems for depositing complex thin-film alloys. In particular, this system may be scaled up without compromising layer spatial uniformity to implement the mass production of advanced solar cell designs and/or any other devices making use of a complex thin-film alloy deposited on a substrate. The manifold of the system may include a plurality of individual conduits arranged in any desired spatial arrangement to enhance the spatial uniformity of the deposited complex thin-film alloy layer. This ability to pattern the conduits of the manifold in any direction to accommodate increases in size of the stacked sublimation sources in a coordinated fashion allows for the implementation of large area deposition sources and associated commercial-scale deposition systems.

In addition, the design of the stacked-source sublimation system may possess at least several other useful capabilities. The composition of films deposited using the system may be graded gradually from a first composition to a second composition across the depth of the layer by slowly opening or closing the vapor feed valves supplying fluxes produced by one or more sublimation sources during deposition. For example, gradual grading from CdTe to $Cd_{1-x}M_xTe$ may be achieved by gradually opening the vapor feed valves controlling the flux from the bottom (M) sublimation source, where M may be a metal including, but not limited to Mg. The composition of films deposited using the system may also be graded spatially across the exposed area of the deposited layer by opening or closing a portion of the vapor feed valves within one or more selected regions supplying fluxes produced by the one or more sublimation sources during deposition. For example, a film with a composition that gradually grades from a first composition at one end of the substrate face to a second composition at an opposite end of the substrate face may be produced; such a layer may be used to assess the impact of the layer composition on layer properties such as band width.

The stacked-source sublimation system's design may be compatible with a variety of deposition source materials. Three or more sublimation sources containing different source materials may be used to form thin-film alloys of higher complexity including, but not limited to, ternary alloys and quaternary alloys. For example, an additional dopant sublimation source may be used for slowly adding dopants to thin-film ternary alloys.

Various aspects of the elements of the stacked-source sublimation system and methods of using the stacked-source sublimation system are described in further detail herein below.

I. Stacked-Source Sublimation System

In one aspect, illustrated schematically in FIG. 1, the stacked-source sublimation system 100 includes a first crucible 102 operatively connected to a first heating element 103. The first crucible 102 forms a first heated pocket 106 containing a first source material 104. The first heated pocket 106 opens upward at a pocket opening 107. The first heating element 103 maintains the first heated pocket 106 at a first temperature independently of the temperatures of other system components. In an aspect, the first temperature may be sufficiently high to form a first flux by sublimating the first source material 104 within the first heated pocket 106.

The stacked-source sublimation system 100 also includes a second crucible 114 operatively connected to a second heating element 116. The second crucible 114 forms a second heated pocket 120 containing a second source material 118. The second heated pocket 120 opens upward into a manifold 124 connecting the second heated pocket 120 to the first heated pocket 106. The second heating element 116 maintains the second heated pocket 120 at a second temperature independently of the temperatures of other system components.

In an aspect, the second temperature may be sufficiently high for the sublimation of the second source material 118 within the second heated pocket 120. The second flux resulting from the sublimation of the second source material 118 may be carried upward into the first heated pocket 106 via the manifold 124 and combined with the first flux to form a deposition mixture. The manifold 124 may include a plurality of vertical conduits 122. These individual conduits 122 may be arranged in any desired spatial pattern, including, but not limited to a uniform distribution over the bottom wall 126 of the first crucible 102, as illustrated in FIG. 1; this uniform distribution of the conduits 122 may enhance the spatial uniformity of the deposition mixture formed by the first flux and the second flux within the first heated pocket 106.

In this aspect, a substrate 108 is situated vertically over the pocket opening 107 at a vertical separation distance of at least about 1 µm. In other aspects, the vertical separation distance may range from about 1 µm to about 30 cm. In this position, the substrate 108 contacts the deposition mixture within the first heated pocket 106. The substrate 108 is operatively connected to a third heating element 112 that maintains the substrate 108 at a third temperature independently of the temperatures of other system components.

In one aspect, the third temperature of the substrate 108 may be slightly cooler than the first temperature within the adjacent first heated pocket 106. This cooler third temperature of the substrate 108 may facilitate the formation of the thin-film alloy layer onto the substrate 108 while limiting the exposure of the growing layer to thermal stresses that may impact the structural and/or electrical properties of the layer.

In one other aspect, the stacked-source sublimation system 100 may be situated within a vacuum device to maintain the system 100 within an operational atmosphere at a pressure ranging from about 0.1 mTorr to about 100 mTorr. Any known vacuum device may be used to produce the operational atmosphere within which the system 100 is situated. Non-limiting examples of suitable vacuum devices include rotary vane pumps, reciprocating piston pumps, rotary piston pumps, scroll pumps, screw pumps, rotary lobe pumps, molecular drag pumps, and any combination thereof. The vacuum device may further include one or more filtration devices operationally connected to the exhaust of the vacuum device to capture vapor byproducts of the deposition process prior to discharging the exhaust into the external atmosphere. Non-limiting examples of suitable filtration devices include cold traps, filters, scrubbers, and any combination thereof.

In this other aspect, the operational atmosphere may include one or more gases of any composition without limitation. Non-limiting examples of compositions of gases suitable for inclusion within the operational atmosphere include inert gases such as Ar, $N_2$, and He, reactive gases such as $O_2$ and $H_2$, and any combination thereof. In another additional aspect, the operational atmosphere is an inert gas atmosphere comprising one or more inert gases including, but not limited to: Ar, $N_2$, He, and any combination thereof.

a. First Crucible and First Heating Element

Referring again to FIG. 1, the stacked-source sublimation system 100 includes the first crucible 102 and associated first heating element 103. The first crucible 102 defines the first heated pocket 106 containing the first source material 104 which is sublimated within the first heated pocket 106 to produce the first flux. The first flux combines with the second flux generated within the second crucible 114 to produce the deposition mixture. The deposition mixture rises and exits the first heated pocket 106 via the pocket exit 107.

The first crucible 102 is designed to provide an evenly distributed deposition mixture to the substrate surface in order to deposit the thin-layer alloy in a spatially uniform manner. In addition, the heated pocket design of the first crucible 102 facilitates the rapid deposition of alloy layers at growth rates as high as 1.0 µm/min or more. This heated pocket design may be easily scaled up or down as needed, making possible the deposition of highly uniform thin-layer alloys at a commercial manufacturing scale for the production of devices including, but not limited to, solar cells.

i. First Crucible

In an aspect, the first crucible 102 includes a bottom wall 126 and at least one side wall 128. The bottom wall 126 and at least one side wall 128 together form a continuous surface defining the first heated pocket 106. The bottom wall 126 and at least one side wall 128 may be constructed using any suitable material which has an acceptable level of thermal conductivity. These suitable materials may further have a low level of porosity to prevent the adsorption of air and water vapor and may contain suitable low levels of impurities. Non-limiting examples of suitable materials for the construction of the first crucible 102 include graphite materials such as purified pyrolytic grade graphite, metals, metals coated with ceramics, and any other known crucible construction material.

In one aspect, the first crucible 102 is constructed from a graphite material. Graphite has high thermal emissivity characteristics, enabling the rapid heating of the first source material 104 within the first heated pocket 106. In addition, graphite has relatively high thermal conductivity characteristics, resulting in a uniform temperature distribution throughout the first heated pocket 106 within the first crucible 102.

The overall dimensions of the bottom wall 126 may be any size or shape without limitation. In one aspect, the bottom wall 126 may be essentially matched in size and shape to the surface of the substrate 108 and is typically a flat horizontal structure. The first heating element 103 may be situated in close proximity and/or attached to the bottom wall 126 as described herein below.

The bottom wall 126 further defines a plurality of openings 130 through which the second flux produced by the second crucible 114 may pass from the second heated pocket 120 to the first heated pocket 106. In one aspect, the plurality of openings 130 may connect to the plurality of conduits 122 of the manifold 124 as illustrated in FIG. 1. In another aspect, the plurality of openings 130 may not be directly connected to a conduit or manifold 124; instead the second flux produced within the second heated pocket 120 may passively rise vertically through the plurality of openings 130.

The plurality of openings 130 may be of any cross-sectional size and shape and may be of any number and distribution without limitation. In an aspect, the number and distribution of openings 130 may be designed to provide a spatially uniform distribution of the second flux transferred from the second heated pocket 120 into the first heated pocket 106. In one aspect, the openings 130 may be uniformly distributed throughout the bottom wall 126. In another aspect, the openings 130 may be asymmetrically distributed to compensate for non-ideal effects such as the effects of the side walls 128 and corners on the flow of the deposition mixture within the first heated pocket 106.

In an aspect, the bottom wall 126 may include textures, indentations, or other features to facilitate the desired distribution of the first source material 104 within the first heated pocket 104. In one aspect, the bottom wall 126 may include raised ridges to facilitate the situating of the first source material 104 at selected regions of the bottom wall 126. In this aspect, the raised ridges may form closed shapes including, but not limited to circles, polygons, and any other closed shape to contain a small amount of the first source material 104 within the region of the closed shape. In another aspect, the bottom wall 126 may contain one or more indentations such as wells formed into the surface of the bottom wall 126. In these various aspects, the textures, indentations, or other features may have any distribution over the area of the bottom wall 126 without limitation.

The one or more side walls 128 are typically oriented vertically and perpendicular to the bottom wall 126, as illustrated in FIG. 1. This vertical orientation facilitates the collimation of the upward flow of deposition mixture, as described herein below. As a result of this vertical wall orientation, the pocket opening 107 formed by the upper edges of the one or more side walls 128 is essentially the same size and shape as the bottom wall 126.

The dimensions of the first crucible 102 may be influenced by any one or more of at least several factors. The pocket opening 107 of the first crucible 102 may be essentially matched in size and shape to the exposed surface of the substrate 108. In addition, the height of the one or more side walls 128 of the first crucible 102 may be sized in order to enhance the function of the first crucible 102 as a heated pocket deposition device, as described herein below.

ii. First Heated Pocket

The first heated pocket 106 formed within the bottom wall 126 and one or more side walls 128 of the first crucible 102: i) receives the first and second fluxes formed by the sublimation of the first source material 104 and second source material 118, respectively, ii) mixes the two fluxes to form a deposition mixture, and iii) delivers the deposition mixture in a spatially uniform distribution to the substrate 108 for deposition. The overall design of the first heated pocket 106 may be based in part on the heated pocket deposition (HPD) devices as described in U.S. Pat. No. 6,423,565, which is hereby incorporated by reference in its entirety. In brief, the heated pocket design makes possible the uniform deposition of a sublimated source material over a substrate surface.

Referring back to FIG. 1, the substrate 108 is situated vertically above the pocket opening 107 and is separated from the first crucible 102 by a small vertical separation distance. This vertical separation may prevent the substrate 108 from touching the first crucible 102 and damaging the deposited alloy films while maintaining a sufficient concentration of deposition mixture within the first heated pocket 106 for deposition at the desired growth rate and uniformity. In one aspect, the vertical separation distance may be sufficiently small to provide a close tolerance slip fit seal between the top of the first crucible 102 and the substrate 108. Any vapor leak through this vertical separation in this aspect will be in the molecular flow regime, effectively allowing the substrate 108 to act as a shutter across the first heated pocket 106.

This shuttering effect of the substrate 108 may enhance the uniform heating of the deposition mixture within the first heated pocket 106. The uniform and high temperature of the deposition mixture within the first heated pocket 106 may inhibit the formation of undesired nanoparticles within the deposition mixture due to gas scattering collisions as described herein below.

In another aspect, the first heated pocket 106 may be at least partially open during both film deposition and in-between deposition on successive substrates 102. Without being limited to any particular theory, by allowing excess deposition mixture material to leave the first heated pocket 106, the sublimation rates of the first source material 104 and the second source material 118 may be maintained, resulting in repeatable deposition characteristics over multiple substrates 108.

In various aspects, the vertical separation distance between the substrate 108 and the pocket opening 107 may be at least about 1 μm. In various other aspects, the vertical separation distance may range from about 1 μm to about 30 cm. This vertical separation distance may vary based on the overall size of the stacked-source sublimation system 100 as well as any one or more of the considerations described herein previously. In one aspect, if the deposition surface of the substrate 108 is about 10 cm×10 cm, the vertical separation distance may range from about 2 mm and about 8 mm. In another aspect, if the deposition surface of the substrate 108 is about 10 cm×10 cm, the vertical separation distance may be about 4 mm.

In an additional aspect, the at least one side wall 128 of the first heated pocket 106 may collimate the vapor flux from the subliming first source material 104 and second source material 118. Since the vertical separation between the substrate 108 and the first crucible 102 is at the top of the first heated pocket 106 and at a right angle to the collimated vapor flux, nearly all of the vapor flux will pass this vertical gap without directly entering this gap. Any vapor which does enter this gap due to gas scattering will be readily deposited on the surface of the substrate 108.

The distance between the first source material 104 and the substrate 108, or alternatively the depth of the first heated pocket 106, is governed by the height of the one or more side walls 128 of the first crucible 102. In one aspect, the depth of the first heated pocket 106 may be sufficient to allow for gas scattering of the deposition mixture within a desired range.

Without being limited to any particular theory, gas scattering is the result of collisions among the molecules of the deposition mixture or between molecules of the deposition mixture and the molecules of the ambient background gas. These collisions deflect and scatter the molecules of the deposition mixture, thereby causing a deviation from a straight vertical path from the first source material 104 to the substrate 108. This scattering of the molecules of the deposition mixture facilitates uniform deposition on the substrate 108. The degree of gas scattering may be expressed in terms of the Knudsen number, defined as the ratio of the mean free path of the vapor flux in the first heated pocket 106 at a given temperature and pressure, divided by the vertical height of the first heated pocket 106 (i.e., the distance between the first source material 104 and the substrate 108). If the Knudsen number is less than 0.01, then the molecules of the deposition mixture within the first heated pocket 106 move in a viscous flow regime and gas scattering will be a significant factor. In the viscous flow regime, this significant gas scattering may lead to such a loss of energy from the molecules of the deposition mixture that they condense to form undesired nanoparticles. For Knudsen numbers greater than 1, the molecules of the deposition mixture move in a molecular flow regime with very little gas scattering. In this molecular flow regime, the molecules of the deposition mixture travel in straight vertical lines to the substrate 108, typically resulting in non-uniform film thickness across the substrate 108. For Knudsen numbers between 0.01 and 1, the molecules of the deposition mixture move in a transition flow regime with some gas scattering. In the transition flow regime, the vapor flux is randomized by gas scattering, but does not condense into undesired nanoparticles before depositing on the substrate 108.

In one aspect, the depth of the first heated pocket 106 results in deposition at Knudsen numbers in the transition regime from 0.07 to 0.44, resulting in the deposit of a uniform film thickness across the substrate 108.

iii. First Heating Element

The first heating element 103 associated with the first crucible 102 maintains the temperature of the first heated pocket 106 at a first temperature independently of other elements of the stacked-source sublimation system 100 including, but not limited to the substrate 108 and the second crucible 114. The first temperature may be selected based on any one or more of at least several factors. The first temperature may be selected to be sufficiently high for the sublimation of the first source material 104 at a desired sublimation rate; this sublimation rate may be further influenced by the ambient pressure within which the system 100 operates. In addition, the first temperature may be selected to inhibit the formation of undesired nanoparticles as the deposition mixture is formed and transported to the surface of the substrate 108. The first temperature may be selected to be higher than the third temperature at which the substrate 108 is maintained to enhance the deposition of the thin-layer alloy onto the substrate 108.

The first temperature may be manipulated to control the process of depositing a thin-film alloy layer on a substrate 108 using the stacked-source sublimation system 100. In one aspect, a higher first temperature may result in a higher growth rate of the thin-film alloy layer on the substrate 108. In another aspect, a higher first temperature may result in a thin film alloy layer containing a smaller proportion of material associated with the sublimation of the first source material 104. For example, if the first source material 104 is CdTe and the second source material 118 is Mg, a higher first temperature may result in a higher proportion of Cd in the $Cd_{1-x}Mg_xTe$ layer.

In an aspect, the stacked-source sublimation system 100 may additionally include a first temperature sensor to monitor the first temperature within the first heated pocket 106. The output of the first temperature sensor may be used as feedback to a control system used to control the first heating element 103 including, but not limited to: a proportional with integral and derivative (PID) controller or any other suitable controller. Non-limiting examples of suitable first temperature sensor devices include: a thermocouple and an infrared temperature sensor.

Any known heating device may be used as the first heating element 103 without limitation. Non-limiting examples of devices suitable for use as a first heating element 103 include: resistive heating devices such as NiCr coils, inductive heating devices, and radiative heating devices such as quartz-halogen lamps. In one aspect, the first heating element 103 may be one or more resistive NiCr coils. In this aspect, the NiCr wire may be embedded into the material of the first crucible 102 using an embedding material including, but not limited to, an alumina-based ceramic material. In another aspect, the first crucible 102 may incorporate a plasma generation device (not shown) to provide an additional degree of control over the properties of the thin-film alloys produced by the system 100.

In an aspect, the first temperature may range from about 100° C. to about 1000° C. In another aspect, if the first source material 104 is CdTe, the first temperature may range from about 540° C. to about 600° C. In this aspect, the first temperature may be influenced by the pressure at which the system 100 is operated as well as other process parameters as described herein above.

iv. First Source Material

The first source material 104 is heated to the first temperature within the first heated pocket 106, resulting in the formation of the first flux by sublimation. Typically, the first source material 104 is provided in a particulate or powdered form. In one aspect, the first source material 104 is distributed in an evenly spaced pattern across the floor of the first heated pocket 106 formed by the bottom wall 126 of the first crucible 102. As described herein previously, the bottom wall 126 may include indentations such as wells and/or raised textures to facilitate the even distribution of the first source material 104 within the first heated pocket 106.

Any known form of the first source material 104 may be used without limitation including, but not limited to: powders, pellets pressed from powder, and/or random chunks. In one aspect, the first source material 104 may be provided in the form of chunks. In another aspect, the chunks may be standardized in size in order to enhance the uniformity of sublimation during deposition. In this other aspect, a quantity of chunks may be processed using known methods including but not limited to sieving to select a sub-quantity of chunks falling within a desired size range. In yet another aspect, the first source material 104 may be provided in the form of chunks with diameters ranging between about 0.067 inches (+12 mesh) and about 0.25 inches.

The composition of the first source material 104 may be any known material capable of being vaporized at a temperature range corresponding to the first temperature as described previously herein without limitation. In various aspects, the composition of the first source material 104 may be any semiconductor material formed by any combination of the elements Zn, Cd, Hg, S, Se, or Te, elements from group IIB and group VIB of the periodic table. In various other aspects, the composition of the first source material 104 may be compound chosen from telluride compounds including, but not limited to CdTe; sulfide compounds including, but not limited to CdS; chloride compounds including, but not limited to $CdCl_2$, $CuCl_2$, and $MgCl_2$, and selenide compounds. In one aspect, the composition of the first source material 104 may be CdS or CdTe. In another aspect, the composition of the first source material 104 is CdTe.

The purity of the first source material 104 may be sufficiently high to avoid the incorporation of unwanted elements into the deposited thin-film alloy and to minimize undesired electrical characteristics. In one aspect, the purity of the first source material 104 is at least 99.9%. In other aspects, the purity of the first source material 104 is at least 99.95%, at least 99.99%, at least 99.995%, and at least 99.999%.

b. Second Crucible, Second Heating Element, and Manifold

Referring again to FIG. 1, the stacked-source sublimation system 100 includes the second crucible 114 and associated second heating element 116. The second crucible 114 defines the second heated pocket 120 containing the second source material 118 which is sublimated within the second heated pocket 120 to produce the second flux. The second flux produced by the second crucible 114 is transferred to the first heated pocket 106 via a manifold 124 connecting the second heated pocket 120 to the first heated pocket 106. The second flux combines with the first flux generated within the first crucible 102 to produce the deposition mixture.

The second crucible 114 is designed to provide an evenly distributed transfer of the second flux to the first heated pocket 106, resulting in the deposition of the thin-layer alloy in a spatially uniform manner onto the substrate 108. In addition, the second crucible 114 is maintained at a second temperature independently of other elements of the system 100. This ability to control the temperature of the second heated pocket 120 provides one means of controlling the sublimation rate of the second source material 118 and by extension the rate of transfer of the second flux to the first heated pocket 106. The second crucible 114 may further include one or more flux control elements to increase or decrease the rate of transfer of the second flux.

This control of the rate of transfer of the second flux provides the ability to control the degree of inclusion of the elements from the second source material 118 in the thin-film alloy deposited on the substrate 108. This degree of inclusion may be manipulated during the deposition process to form layers with abrupt changes in composition and/or gradually graded changes in composition as desired.

The second crucible 114 makes use of a heated pocket design similar to the design of the first crucible 102. The size, shape and other dimensions and operational parameters of the second crucible 114 may be varied independently of the other elements of the system 100 including, but not limited to, the first crucible 102. In one aspect, the second crucible 114 may be increased or decreased in size in proportion to changes in the size of the first crucible 102. In this aspect, the coordinated changes in size of the first crucible 102 and second crucible 114 make possible the scaling of the stacked-source sublimation system 100 up or down in size with minimal impact on the uniformity of the thin-film alloys produced by the system 100.

In another aspect, stacked-source sublimation system 100 may include two or more second crucibles 114. In this aspect, the additional second crucibles 114 may be added or subtracted in proportion to changes in the size of the first crucible 102. The inclusion of the two or more second crucibles 114 may enhance the degree of control over the uniformity of the second flux produced in this aspect.

i. Second Crucible

In various aspects, the second crucible 114 is similar in design to the design of the first crucible 102. In an aspect, the second crucible 114 includes a bottom wall 132 and at least one side wall 134. The bottom wall 132 and at least one side wall 134 together form a continuous surface defining the second heated pocket 120. Unlike the first heated pocket 106 which opens upward at the pocket opening 107, the second heated pocket 120 is an enclosed volume in various aspects. This enclosed volume of the second heated pocket 120 provides an enhanced degree of control over the rate of production and transfer of the second flux, thereby enhancing the capability to control the degree of inclusion of the elements contained in the second flux within the deposited thin-layer alloy as described previously herein.

In one aspect, the second heated pocket 120 is enclosed by the bottom wall 132, the at least one side wall 134, as well as a manifold 124 which forms an upper boundary of the second heated pocket 120 as illustrated in FIG. 1. In another aspect, illustrated in FIG. 8, the upper boundary of the second heated pocket 120 is formed by the bottom wall 126 of the first crucible 102; in this aspect, the side walls 134 extend upward and are sealed to the bottom wall 126 of the first crucible 102.

In another aspect, a heat shield 138 may be situated between the first crucible 102 and the second crucible 114. In this aspect, the heat shield 138 may thermally separate the first crucible 102 and the second crucible 114, thereby enhancing the ability to regulate independently the first temperature within the first heated pocket 106 and the second temperature within the second heated pocket 120. In this aspect, the heat shield 138 may be produced using any one or more known heat shielding materials including, but not limited to metals, ceramics, and/or any other known heat shield material. The heat shield 138 may be provided in the form of a single material layer, or the heat shield 138 may be provided in the form of a composite structure containing two or more layers of different materials. In an additional aspect, the heat shield 138 may a composite structure containing multiple alternating layers of alumina ceramic sheets and stainless steel foil sheets.

The bottom wall 132, and the at least one side wall 134 may be constructed using any suitable material which has an acceptable level of thermal conductivity similar to those materials described for the construction of the first crucible 102. These suitable materials may further have a low level of porosity to prevent the adsorption of air and water vapor and may contain suitable low levels of impurities. Non-limiting examples of suitable materials include graphite materials such as purified pyrolytic grade graphite, metals, metals coated with ceramics, and any other known crucible construction material.

In one aspect, the second crucible 114 is constructed from a graphite material. Graphite has high thermal emissivity characteristics, enabling the rapid heating of the second source material 118 within the second heated pocket 120. In addition, graphite has relatively high thermal conductivity characteristics, resulting in a uniform temperature distribution throughout the second heated pocket 120.

The overall dimensions of the bottom wall 132 and the at least one side wall 134 may be any size or shape without limitation. In one aspect, the bottom wall 132 may be essentially matched in size and shape to the size and shape of the bottom wall 136 of the first crucible 102 and is typically a flat horizontal structure. The second heating element 116 may be situated in close proximity and/or attached to the bottom wall 132 as described herein below.

In an aspect, the bottom wall 132 may include textures, indentations, or other features to facilitate the desired distribution of the second source material 118 within the second heated pocket 120. In one aspect, the bottom wall 132 may include raised ridges to facilitate the situating of the second source material 118 at selected regions of the bottom wall 132. In this aspect, the raised ridges may form closed shapes including, but not limited to circles, polygons, and any other closed shape to contain a small amount of the second source material 118 within the region of the closed shape. In another aspect, the bottom wall 132 may contain one or more indentations such as wells formed into the surface of the bottom wall 132. In these various aspects, the textures, indentations, or other features may have any distribution over the area of the bottom wall 132 without limitation.

The at least one side wall 134 is typically oriented vertically and perpendicular to the bottom wall 132, as illustrated in FIG. 1. This vertical orientation facilitates the collimation of the upward flow of the second flux, as described previously herein in connection with the design of the first crucible 102.

The dimensions of the second crucible 114 may be influenced by any one or more of at least several factors. The top of the second crucible 114 may be essentially matched in size and shape to the bottom of the first crucible 102. In addition, the height of the at least one side wall 134 may be sized in order to enhance the function of the second crucible 114 as a heated pocket deposition device, as described herein previously. For example, the at least one side wall 134 may be dimensioned such that the second crucible functions at a Knudsen number ranging from about 0.07 to about 0.44 as described herein previously.

ii. Second Heated Pocket

The second heated pocket 120 formed within the bottom wall 132 and at least one side wall 134 of the first crucible 114: i) produces the second flux formed by the sublimation of the second source material 118 and ii) delivers the second flux to the first heated pocket 106 at a controlled rate. The overall design of the second heated pocket 114 may be similar to the design of first heated pocket 106 with one distinction: the second heated pocket 114 is a closed volume.

The closed volume design of the second heated pocket 114 may enhance the uniform heating of the second flux within the second heated pocket 114. The uniform and high temperature of the second flux within the second heated pocket 114 may inhibit the formation of undesired nanoparticles within the second flux due to gas scattering collisions as described herein previously. In an additional aspect, the at least one side wall 134 of the first heated pocket 106 may collimate the second flux from the subliming second source material 118.

The distance between the second source material 118 and the bottom of the first crucible 102, or alternatively the depth of the second heated pocket 120, is governed by the height of the at least one side walls 134 of the second crucible 114. In one aspect, the depth of the second heated pocket 120 may be sufficient to allow for gas scattering of the second flux within a desired range as described previously herein.

iii. Manifold and Flux Control Elements

Figure 8:
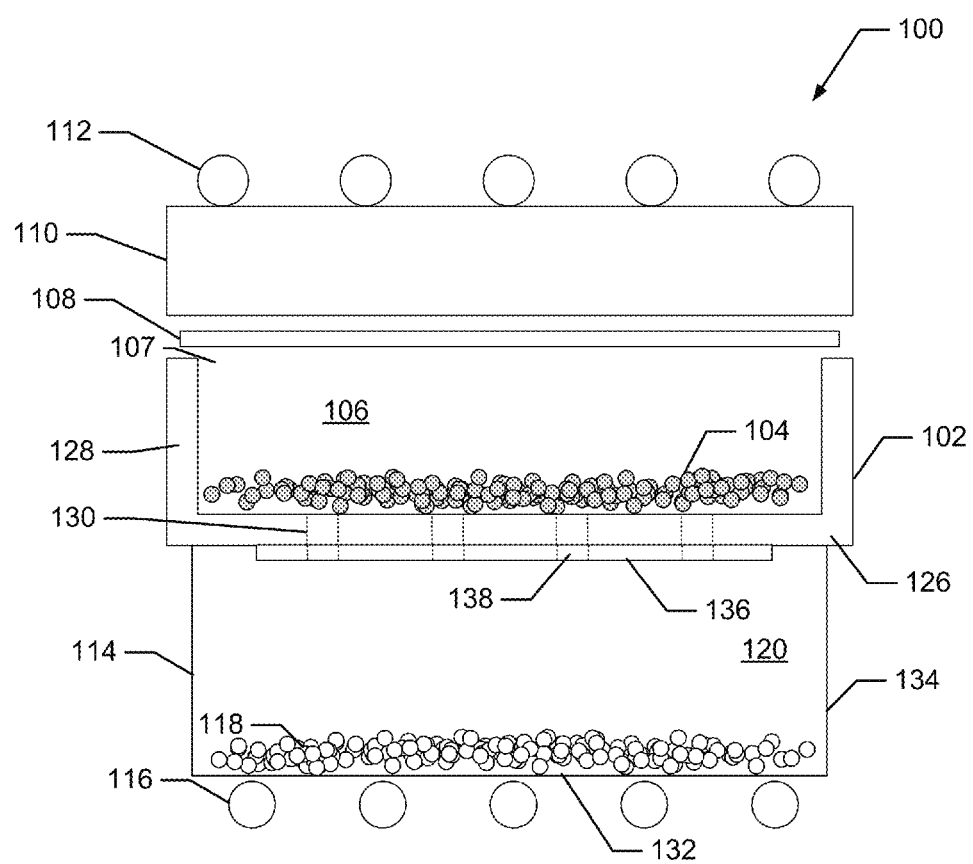
FIG. 8 is a schematic diagram of a stacked-source sublimation system.

In various aspects, the second flux formed by the sublimation of the second source material 118 within the second heated pocket 120 may be transferred at a controlled rate to the first heated pocket 106 by a variety of means. In one aspect, the second flux may be transferred by way of a plurality of openings 130 formed through the bottom wall 126 of the first crucible 102, as illustrated in FIG. 8. In this aspect, the second flux may passively rise and pass from the second heated pocket 120 to the first heated pocket 106 by way of the openings 130. As described herein previously, the openings may have any size, shape, and/or spatial distribution without limitation. In an aspect, the size, shape, and spatial distribution of the openings 130 may be configured to provide a spatially uniform transfer of the second flux into the first heated pocket 106.

In another aspect, the second flux may be transferred at a controlled rate to the first heated pocket 106 through a manifold 124 as illustrated in FIG. 1. In this aspect, the manifold 124 may include a plurality of conduits 122 connected to the plurality of openings 130 on the bottom wall 126 of the first crucible 102. The length, cross-sectional shape and dimensions, number, and spatial distribution of the plurality of openings 130 may vary without limitation. Typically, the particular configuration of the conduits 122 of the manifold 124 are designed based on any one or more of at least several considerations including, but not limited to: inhibition of nanoparticle formation; uniform transfer of second flux into first heated pocket 106, and control of rate of transfer of second flux. For example, the combined cross-sectional area of all conduits 122 of a manifold 124 may influence the capacity of the manifold 124 to transfer the second flux to the first heated pocket 106.

In various aspects, the rate of transfer of the second flux may be regulated by manipulation of the second temperature at which the second heated pocket 120 is maintained. For example, if the second temperature is increased, the sublimation rate of the second source material 118 is increased, with a corresponding increase in the rate of transfer of the second flux. In other aspects, additional flux control elements may be incorporated into the second crucible including, but not limited to: adjustable flow valves, adjustable shutter plates, and any other suitable flow control device. The additional flux control elements may be used in lieu of, or in addition to, the manipulation of the second temperature to control the rate of transfer of the second flux.

In one aspect, the plurality of adjustable valves 136 may be operatively connected to the plurality of conduits 122 of the manifold 124 as illustrated in FIG. 1. In this aspect, the plurality of adjustable valves 136 may occlude the plurality of conduits 122 when the valves 136 are adjusted to a closed position. In an open position, the valves 136 permit the unimpeded transfer of the second flux through the conduits 122.

In another aspect, an adjustable shutter plate 136 may be operatively connected to the second crucible 114 to regulate the rate of transfer of the second flux as illustrated in FIG. 8. In this aspect, the shutter plate 136 may be a thin plate containing a plurality of holes 138 corresponding to the size, shape, and spatial distribution of the plurality of openings in the bottom wall 126 of the first crucible 102. When the shutter plate 136 is adjusted to an open position, as illustrated in FIG. 8, the plurality of holes 138 are aligned with the plurality of openings 130, permitting the unimpeded transfer of the second flux into the first heated pocket 106. When the shutter plate 136 is adjusted to a closed position by sliding to the left or right along the bottom wall 126, the plurality of holes 138 are shifted out of alignment with the plurality of openings 130, resulting in the occlusion of the openings 130 and blocking the transfer of the second flux into the first heated pocket 106.

In yet another aspect, the additional flux elements may be operated to either permit or block the transfer of the second flux in an "on-off" manner. In another additional aspect, the additional flux elements may be gradually adjusted during deposition to gradually increase or decrease the rate of transfer of the second flux. In this manner, the additional flux elements may be used to produce thin-film alloys with variable compositions including, but not limited to an abrupt change in composition, a gradual change in composition, or a combination thereof.

iv. Second Heating Element

The second heating element 116 associated with the second crucible 114 maintains the temperature of the second heated pocket 120 at a second temperature independently of other elements of the stacked-source sublimation system 100 including, but not limited to the substrate 108 and the first crucible 102. The second temperature may be selected based on any one or more of at least several factors. The second temperature may be selected to be sufficiently high for the sublimation of the second source material 118 at a desired sublimation rate; this sublimation rate may be further influenced by the ambient pressure within which the system 100 operates. In addition, the second temperature may be selected to inhibit the formation of undesired nanoparticles as the second flux is formed and transported to the first heated pocket 106. The second temperature may be selected to be lower than the first temperature at which the first heated pocket 106 is maintained to inhibit the condensation of the second flux within the first heated pocket 106 during the mixing of the first flux and the second flux to form the deposition mixture, and may further inhibit the formation of undesired nanoparticles within the first heated pocket 106.

The second temperature may be manipulated to control the process of depositing a thin-film alloy layer on a substrate 108 using the stacked-source sublimation system 100. In one aspect, a higher second temperature may result in a higher proportion of second flux elements in the deposition mixture and by extension a higher proportion of these second flux elements in the deposition thin-film alloy layer. For example, if the first source material 104 is CdTe and the second source material 118 is Mg, a higher second temperature may result in a higher proportion of Mg in the $Cd_{1-x}Mg_xTe$ layer.

In an aspect, the stacked-source sublimation system 100 may additionally include a second temperature sensor to monitor the second temperature within the second heated pocket 120. The output of the second temperature sensor may be used as feedback to a control system used to control the second heating element 116 including, but not limited to: a proportional with integral and derivative (PID) controller or any other suitable controller. Non-limiting examples of suitable second temperature sensor devices include: a thermocouple and an infrared temperature sensor.

Any known heating device may be used as the second heating element 116 without limitation. Non-limiting examples of devices suitable for use as a second heating element 116 include: resistive heating devices such as NiCr coils, inductive heating devices, and radiative heating devices such as quartz-halogen lamps. In one aspect, the second heating element 116 may be one or more resistive NiCr coils. In this aspect, the NiCr wire may be embedded into the material of the second crucible 114 using an embedding material including, but not limited to, an alumina-based ceramic material.

In one aspect, the second temperature may range from about 100° C. to about 1000° C. during deposition. In another aspect, if the second source material 118 is Mg, the second temperature may range from about 350° C. to about 520° C. during deposition. In this aspect, the second temperature may be influenced by the pressure at which the system 100 is operated as well as other process parameters as described herein above.

In additional aspects, if the second source material 118 is prone to the formation of an oxidation layer, this oxidation layer may be removed prior to the initiation of deposition using any known method including, but not limited to forming a plasma from the second source material 118, sputtering the second source material 118 in situ, and preheating the second source material 118 to burn off the residual oxide layer. In one additional aspect, the second crucible 114 may be heated to an elevated temperature prior to the initiation of deposition in order to burn off any oxidation layer on the second source material 118. For example, if the second source material 118 is Mg metal, the second crucible 114 may be heated to a second temperature of about 520° C. to remove any residual MgO that may have formed on the surface of the Mg source material.

v. Second Source Material

The second source material 118 is heated to the second temperature within the second heated pocket 120, resulting in the formation of the second flux by sublimation. Typically, the second source material 118 is provided in a particulate or powdered form. In one aspect, the second source material 118 is distributed in an evenly spaced pattern across the floor of the second heated pocket 120 formed by the bottom wall 132 of the second crucible 114. As described herein previously, the bottom wall 132 may include indentations such as wells and/or raised textures to facilitate the even distribution of the second source material 118 within the second heated pocket 120.

Any known form of the second source material 118 may be used without limitation including, but not limited to: powders, pellets, pellets pressed from powder, and/or random chunks. In one aspect, the second source material 118 may be provided in the form of pellets. In another aspect, the pellets may be standardized in size in order to enhance the uniformity of sublimation during deposition. Sublimation-grade pellets suitable for use as a second source material 118 are readily available through commercial sources.

The composition of the second source material 118 may be any known material capable of being vaporized at a temperature range corresponding to the second temperature as described previously herein without limitation. In various other aspects, the composition of the second source material 118 may be a metal chosen from Mg, Zn, Mn, Cu, Hg, Bi, Pb, and Cd or a compound chosen from telluride compounds including, but not limited to CdTe; sulfide compounds including, but not limited to CdS; chloride compounds including, but not limited to $CdCl_2$, $CuCl_2$, and $MgCl_2$; and selenide compounds. The choice of second source material 118 may be based on the composition of the first source material 104, the desired composition of the thin-film alloy, and the desired electrical properties of the thin-film alloy such as band gap. In one aspect, the composition of the second source material 118 is Mg.

In various additional aspects, the second source material 118 may be any semiconductor material formed by any combination of the elements Zn, Cd, Hg, S, Se, or Te, elements from group IIB and group VIB of the periodic table, or any other suitable material. Non-limiting examples of suitable semiconductor materials and other suitable materials include: CdS, Cd, Te, $CdCl_2$, and $MgCl_2$.

In one additional aspect, the composition of the second source material 118 may be CdS. In this one additional aspect, if the composition of the first source material 104 is CdTe, the composition of the deposited thin-film alloy layer may be $CdS_xTe_{1-x}$.

The purity of the second source material 118 may be sufficiently high to avoid the incorporation of unwanted elements into the deposited thin-film alloy and to minimize undesired electrical characteristics. In one aspect, the purity of the second source material 118 is at least 99.9%. In other aspects, the purity of the second source material 118 is at least 99.95%, at least 99.99%, at least 99.995%, and at least 99.999%.

c. Substrate and Third Heating Element

Referring back to FIG. 1, the substrate 108 is situated vertically above the pocket opening 107 of the first crucible 102. The deposition mixture produced within the first crucible 102 exits the pocket opening 107 and forms the thin-film alloy layer upon contact with the substrate surface. The third heating element 112 maintains the substrate 108 at a third temperature which is typically cooler than the first temperature at which the deposition mixture is maintained within the first crucible 102. This cooler temperature may enhance the deposition of the deposition mixture onto the substrate 108.

i. Substrate

In various aspects, the substrate 108 is a thin plate that is situated horizontally and in vertical alignment with the pocket opening 107. Although the substrate 108 is typically planar, slightly curved substrate geometries may also be compatible with the system 100. The substrate 108 is situated slightly above the pocket opening 107 at a slight vertical separation distance, as described herein previously, to enhance the uniformity of the thin-film alloy layer deposited on the substrate 108.

The substrate may be made of any suitable material capable of withstanding the elevated temperatures at which the system 100 operates, which may be as high as 620° C. within the first heated pocket 106. In various aspects, the substrate may be any suitable material including but not limited to: glass materials such as soda-lime glass; semiconductor materials such as CdTe, CdS, Si, and Ge; metals; and any other suitable substrate material.

ii. Third Heating Element

In various aspects, the substrate 108 may be maintained at a third temperature using a third heating element 112. The third heating element 112 maintains the substrate 108 at this third temperature independently of other elements of the stacked-source sublimation system 100 including, but not limited to the first crucible 102. The third temperature may be selected based on any one or more of at least several factors. The third temperature may be selected to be lower than the first temperature at which the deposition mixture is maintained in the first crucible 102; the cooler substrate surface may enhance the deposition of the thin-film alloy onto the substrate 108. The third temperature may be further selected to be sufficiently low so as to inhibit the reaction of the deposited thin-film layer with the material of the underlying substrate 108. The third temperature may further be selected to be high enough to inhibit the formation of defects during deposition due to thermal stress effects. In addition, the third temperature may influence the growth rate of the deposited thin-film alloy layer, and well as various physical and/or electrical properties of the deposited thin-film alloy layer including, but not limited to: grain size, surface roughness, orientation, film doping, and band gap.

In an aspect, a heat transfer plate 110 may be situated between the third heating element 112 and the substrate 108 as illustrated in FIG. 1. The heat transfer plate 110 may enhance the spatial uniformity of the heat produced by the third heating element 112, resulting in lower spatial variation in the surface temperature of the substrate 108. The heat transfer plate 110 may be constructed of a thermally conductive material similar to the materials used to construct the first crucible 102 including, but not limited to include graphite materials such as purified pyrolytic grade graphite, metals, metals coated with ceramics, and any other known crucible construction material. In an aspect, the heat transfer plate 110 is constructed from a graphite material.

In an aspect, the stacked-source sublimation system 100 may additionally include a third temperature sensor to monitor the third temperature of the substrate 108. The output of the third temperature sensor may be used as feedback to a control system used to control the third heating element 112 including, but not limited to: a proportional with integral and derivative (PID) controller or any other suitable controller. Non-limiting examples of suitable third temperature sensor devices include: a thermocouple, an infrared temperature sensor, and a pyrometer. In an aspect, the third temperature sensor is a pyrometer.

Any known heating device may be used as the third heating element 112 without limitation. Non-limiting examples of devices suitable for use as a third heating element 112 include: resistive heating devices such as NiCr coils, inductive heating devices, and radiative heating devices such as quartz-halogen lamps. In one aspect, the third heating element 112 may be one or more resistive NiCr coils. In this aspect, the NiCr wire may be embedded into the material of the heat transfer plate 110 using an alumina-based ceramic material.

In an aspect, the third temperature may range from about 100° C. to about 1000° C. during deposition. In another aspect, if the first source material 104 is CdTe and the second source material 118 is Mg, the third temperature may range from about 300° C. to about 550° C. during deposition. In this aspect, the third temperature may be influenced by the pressure at which the system 100 is operated as well as other process parameters as described herein above.

d. Additional Crucibles, Heating Elements, and Manifolds

In various other aspects, the stacked-source sublimation system 100 may incorporate additional elements to provide further enhancements to the capabilities of the system 100 to provide the capability to produce a wide variety of complex thin-film alloy layers. In one aspect, the system 100 may further include additional crucibles and associated additional manifolds. Each additional crucible defines an individual heated pocket within which an additional source material may be heated to a temperature suitable for producing an additional flux by sublimation. The additional manifold associated with each additional crucible may transfer the additional flux from the additional heated pocket to the first heated pocket 106. Within the first heated pocket 106, the first flux, second flux, and any additional fluxes may be combined to produce a deposition mixture to be deposited on the substrate 108.

In this aspect, the additional crucible may be used to produce a variety of ternary and quaternary thin film alloys. For example, if the first source material is CdTe, the second source material is Mg, and the additional source material is Zn, the system 100 in this aspect may be used to produce a quaternary $Cd_{1-x-y}Mg_xZn_yTe$ alloy. Depending on the configuration and utilization of flux control elements associated with each of the crucibles, the system 100 may be used to produce a ternary $Cd_{1-x}Mg_xTe$ ternary alloy transitioning to a $Cd_{1-y}Zn_yTe$ ternary alloy in an abrupt of graded fashion by successively occluding/opening the manifold associated with the Zn source and concomitantly opening/occluding the manifold associated with the Mg source. In another example, the manifold associated with the Zn source may be opened in one region and occluded in other regions of the substrate face, and the manifold associated with the Mg source may be opened in one region and occluded in other regions of the substrate face to produce a $Cd_{1-y}Zn_yTe$ composition in one region of the substrate face that gradually transitions to a $Cd_{1-x}Mg_xTe$ composition in another region of the substrate face.

The modular design of the additional crucibles allows the system 100 to be configured to produce a wide variety of complex alloy layers with a wide variety of spatial arrangements and variations in composition throughout the depth of the alloy layer and/or across the exposed face of the substrate.

e. Integration into Manufacturing Systems

In various aspects, the stacked source sublimation system 100 may be scaled up or down as needed including, but not limited to scaling up to commercial production scales. In an aspect, the system 100 may be integrated into existing manufacturing equipment and processes to enhance the abilities of the equipment and processes to produce materials such as complex thin-film alloy layers.

For example, the system 100 may be integrated into a commercial device that incorporates additional manufacturing features including, but not limited to: multiple pretreatment/deposition/annealing/post-treatment stations, and automated positioning of the substrate at the multiple stations.

Figure 3:
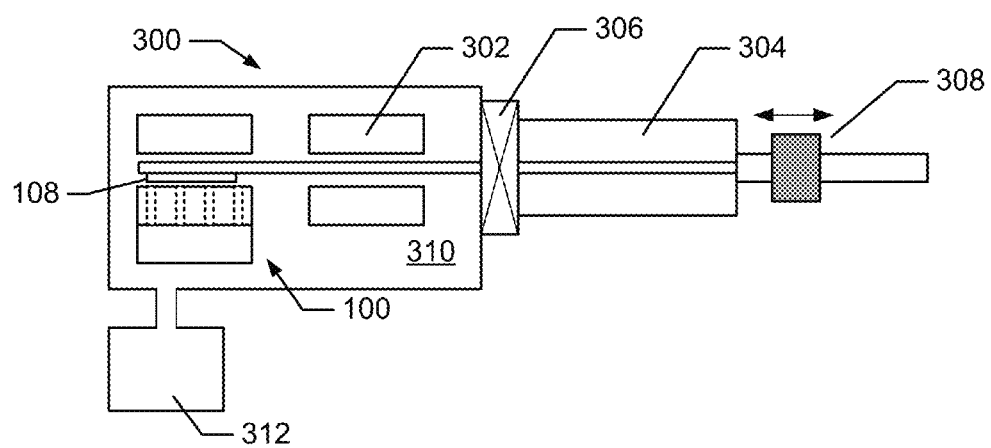
FIG. 3 is a schematic illustration of a manufacturing system that includes a stacked-source sublimation system in an aspect.

In one aspect, the stacked source sublimation system 100 may be integrated into a manufacturing system 300 as illustrated schematically in FIG. 3. The stacked source sublimation system 100 may be situated within the manufacturing system 300. In this aspect, the manufacturing system 300 may further include a substrate preheater 302, a load lock 304 and a gate valve 306 for quick introduction of the substrate 108 and source materials, and a magnetic transfer arm 308 to move the substrate 108 from the substrate preheater 302 to the stacked source sublimation system 100 according to a predetermined schedule. The manufacturing system 300 may further include a diffusion pump 312 to maintain the interior volume 310 at a predetermined base pressure that may be below $10^{-5}$ Torr. The diffusion pump 312 may be outfitted with liquid nitrogen and water cold traps to prevent the inadvertent release of vapor products outside of the manufacturing system 300.

In other aspects, the manufacturing system 300 may further include additional process stations in any sequence and/or arrangement without limitation to implement other manufacturing processes. Non-limiting examples of additional process stations include: substrate cleaning stations, additional material deposition stations, halogen substance treatment stations, annealing stations, back contact formation stations, substrate cooling stations, scribing stations, interconnection screen printing stations, and any other suitable additional process stations. In an additional aspect, the stacked source sublimation system 100 may be integrated into a manufacturing system similar to the system described in U.S. Pat. No. 6,423,565, which is incorporated by reference herein in its entirety.

f. Compositions of Complex Thin-Film Alloys

In various aspects, the stacked-source sublimation system 100 may be used to deposit a variety of complex thin-film alloy layers on a substrate 108. Non-limiting examples of complex thin-film alloy compositions that may be produced using the system include: $Cd_{1-x}Mg_xTe$, $Cd_{1-x}Zn_xTe$, $Cd_{1-x}Mn_xTe$, $Cd_{1-x}Hg_xTe$, $Cd_{1-x}Bi_xTe$, $Cd_{1-x}Pb_xTe$, $Cd_{1-x}Mg_xS$, $Cd_{1-x}Zn_xS$, $Cd_{1-x}Mn_xS$, and $CdS_xTe_{1-x}$, and ZnMgTe.

In one aspect, the composition of the complex thin-film alloy layer produced by the system 100 may be $Cd_{1-x}Mg_xTe$. In this aspect, the process parameters including but not limited to the heated pocket temperatures and the position of any flux control elements may be manipulated to vary the proportions of Cd and Mg included in the thin-film alloy, as quantified by x. In this aspect, x may vary from 0 (i.e. pure CdTe) to about 0.4-0.8. $Cd_{1-x}Mg_xTe$ may become highly hygroscopic and degrade in atmospheric conditions when x exceeds 0.4.

II. Methods of Using Stacked-Source Sublimation System

Figure 9:
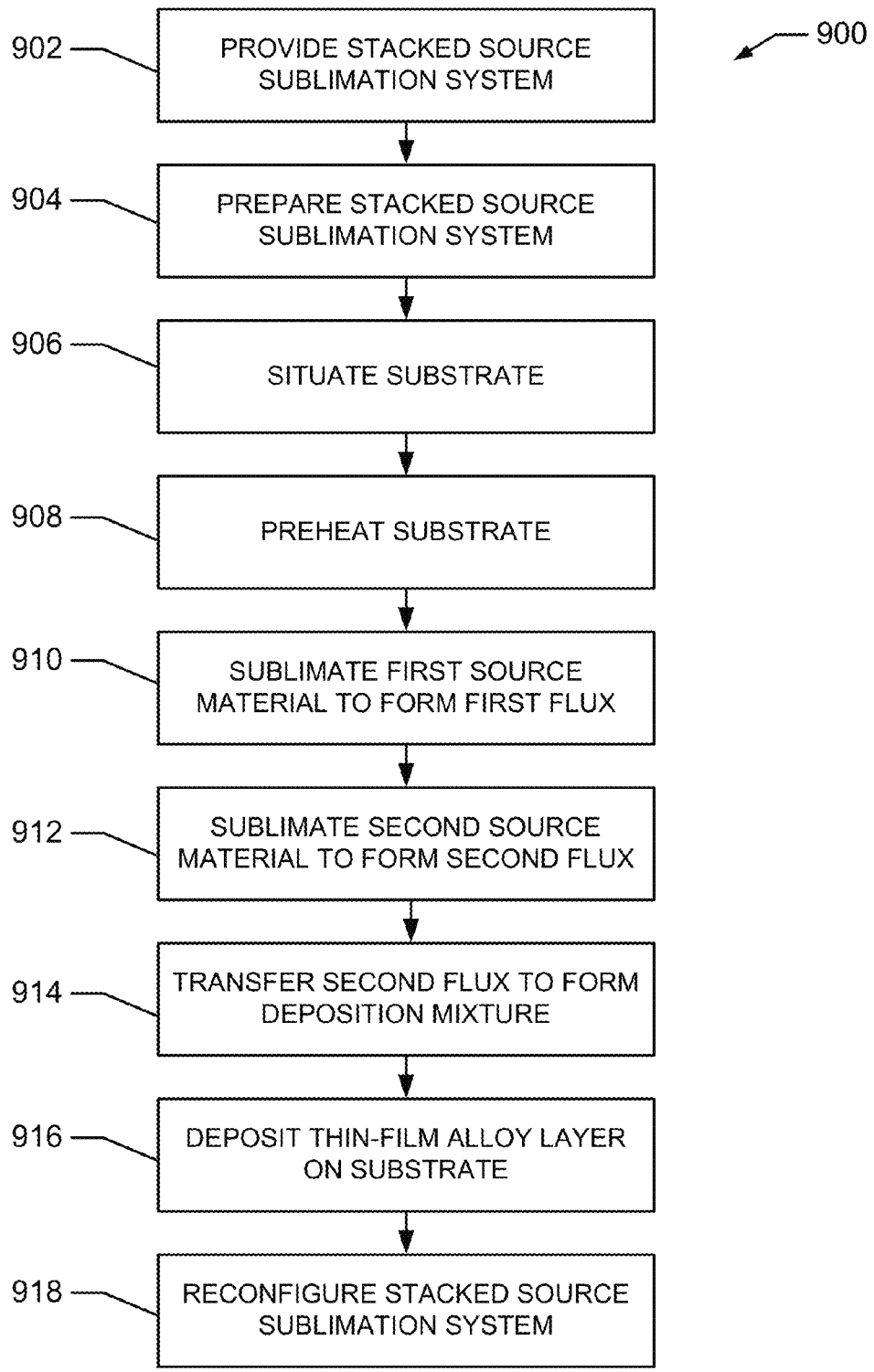
FIG. 9 is a flow chart illustrating the steps of a method for depositing a thin-film alloy layer on a substrate using a stacked-source sublimation system.

In various aspects, the stacked-source sublimation system 100 may be used to produce a thin-film alloy. A flow chart illustrating a method 900 of depositing a thin-film alloy on a substrate in one aspect is provided as FIG. 9.

a. Providing Stacked-Source Sublimation System

In this aspect, the method 900 includes providing the stacked-source sublimation system at step 902. The stacked-source sublimation system is described herein previously and is illustrated in FIG. 1 in one aspect. In one non-limiting example, the stacked source sublimation system may include: a first crucible defining a first heated pocket opening upward at a pocket opening, a second crucible situated vertically below the first crucible and defining a second heated pocket; and a manifold vertically situated between the first crucible and the second crucible and connecting the second heated pocket to the first heated pocket.

b. Preparing Stacked-Source Sublimation System

In this aspect, the method 900 further includes preparing the stacked-source sublimation system at step 904. The first and second source materials may be loaded into the first and second crucibles of the system, respectively in an even spatial distribution as described herein previously. The operational atmosphere may also be established at this step as described herein previously. For example, an Argon atmosphere of about 40 mTorr may be established at step 904 in an aspect.

Also at step 904, the first and/or second source materials may be heated to an elevated temperature to remove any residual oxidation layers from the surface of the source material pieces as described previously herein above. For example, if the source material is pure Mg, the Mg source material may be heated up to about 560° C. at step 904, and then reduced to a lower temperature during the deposition of the thin-film alloy in later steps.

c. Situating and Preheating Substrate

The substrate may be situated within the system at step 906. The substrate may be situated in a horizontal orientation with the deposition surface facing downward above the pocket opening of the first crucible as described herein previously. In addition, the substrate may be vertically aligned over the pocket opening at a vertical separation distance as described previously herein. In an aspect, this vertical separation distance may be at least about 1 μm.

At step 908, the substrate may be preheated and maintained at the third temperature as described previously herein. In one aspect, the preheating of the substrate may take place in a separate dedicated station, as described previously herein and illustrated in FIG. 3. Typically, the substrate is maintained at temperature that is lower than the first temperature at which the deposition mixture exiting the pocket opening of the first crucible is maintained.

d. Sublimating First Source Material

At step 910, the first source material may be sublimated in the first crucible at a first temperature to form a first flux as described herein previously. The first temperature may be manipulated as described herein previously to adjust aspects of the deposition process including, but not limited to: the growth rate of the thin-film alloy layer and the relative inclusion of elements from the first flux within the composition of the thin film alloy layer.

e. Sublimating Second Source Material

At step 912, the second source material may be sublimated in the second crucible at a second temperature to form a second flux as described herein previously. The second temperature may be manipulated as described herein previously to adjust aspects of the deposition process including, but not limited to the relative inclusion of elements from the second source material within the composition of the thin film alloy layer.

f. Transferring Second Source Material

At step 914, the second flux formed at step 912 may be transferred from the second heated pocket to the first heated pocket as described herein previously to form the deposition mixture. The deposition mixture is formed by the combination of the elements of the first flux and the elements of the second flux. In one aspect and as described herein previously, the first heated pocket and second heated pocket may be designed to operate at a Knudsen number associated with an intermediate flow regime in order to facilitate the spatially uniform mixing of the first flux and second flux while inhibiting the formation of unwanted nanoparticles.

In one aspect, the second flux may rise within the second heated pocket and passively move into the first heated pocket via the manifold, which may include a plurality of conduits, as described herein previously. In another aspect, adjustable flux control elements including but not limited to adjustable flow valves, may be adjusted to regulate the rate of transfer of the second flux to the first heated pocket as described herein previously. The adjustment of the flux control elements may regulate aspects of the deposition process including, but not limited to the relative inclusion of elements from the second source material within the composition of the thin film alloy layer. In another aspect, the flux control elements may be used in addition to, or in lieu of, the manipulation of the second temperature within the second heated pocket as a means of controlling the composition of the thin-film alloy layer.

g. Depositing Thin-Film Alloy

In an aspect, the method 900 may further include depositing the thin-film alloy layer on the surface of the substrate at step 916. In one aspect, the deposition mixture formed in the first heated pocket rises upward out of the pocket opening and contacts the surface of the substrate situated immediately above the pocket exit. Upon contact with the cooler substrate surface, the deposition mixture condenses to form the thin-film alloy layer.

The thickness of the thin-film alloy layer formed at step 916 may vary depending on the growth rate of the system and the duration of the deposition at this step. In one non-limiting example, the system may be capable of growing a film with a depth of about 1 micrometer in about two minutes. This growth rate may be influenced by any one or more of at least several factors including, but not limited to the first and second flux rates, the temperature of the substrate surface, as well as the duration of the deposition.

h. Reconfiguring System

The method 900 may further include reconfiguring the system at step 918. As described herein previously, the substrate may be removed to expose the first heated pocket, resulting in the clearing of the contents of the first heated pocket. In one aspect, the reconfiguration of the system at step 918 may enhance the repeatability and uniformity of the thin-film alloy layers formed on successive substrates using this method 900.

EXAMPLES

The following examples illustrate various aspects of the present disclosure.

Example 1

Optical Properties of $Cd_{1-x}Mg_xTe$ Thin Film Alloy Deposited Using Prototype Stacked-Source Sublimation System To demonstrate the feasibility of depositing a $Cd_{1-x}Mg_xTe$ thin film alloy using a prototype stacked source sublimation system and method described herein above, the following experiments were performed.

A prototype stacked source sublimation system was situated within a vacuum deposition system and used to deposit CdTe and $Cd_{1-x}Mg_xTe$ layers on a glass substrate. The vacuum deposition system included a mass flow controller that maintained a base pressure of $4 \times 10^{-2}$ Torr of Argon through the deposition processes.

The prototype stacked source sublimation system 100 similar to the system described herein above and illustrated schematically in FIG. 1 was used to perform the deposition experiments.

A CdTe layer was deposited on the substrate using the prototype system. The CdTe source material was sublimated in the upper crucible at a temperature of between about 500° C. and about 620° C. and rose upward through the deposition pocket toward the substrate, which was maintained at a temperature of between about 450° C. and about 520° C. The rising CdTe vapor formed into a polycrystalline layer upon contact with the cooler substrate.

In addition, a $Cd_{1-x}Mg_xTe$ layer was deposited on the substrate using similar conditions to those described above. In addition, the Mg pellets were sublimated in the lower crucible at a temperature of between about 400° C. and about 560° C. after an initial heating up to about 560° C. to remove any residual MgO that may have formed on the Mg pellets prior to deposition. The Mg vapor produced by sublimation was introduced into the deposition pocket via the manifold. The mixture of Mg vapor and CdTe vapor combined in the deposition pocket to form a polycrystalline $Cd_{1-x}Mg_xTe$ layer upon contact with the glass/CdTe substrate.

Figure 2:
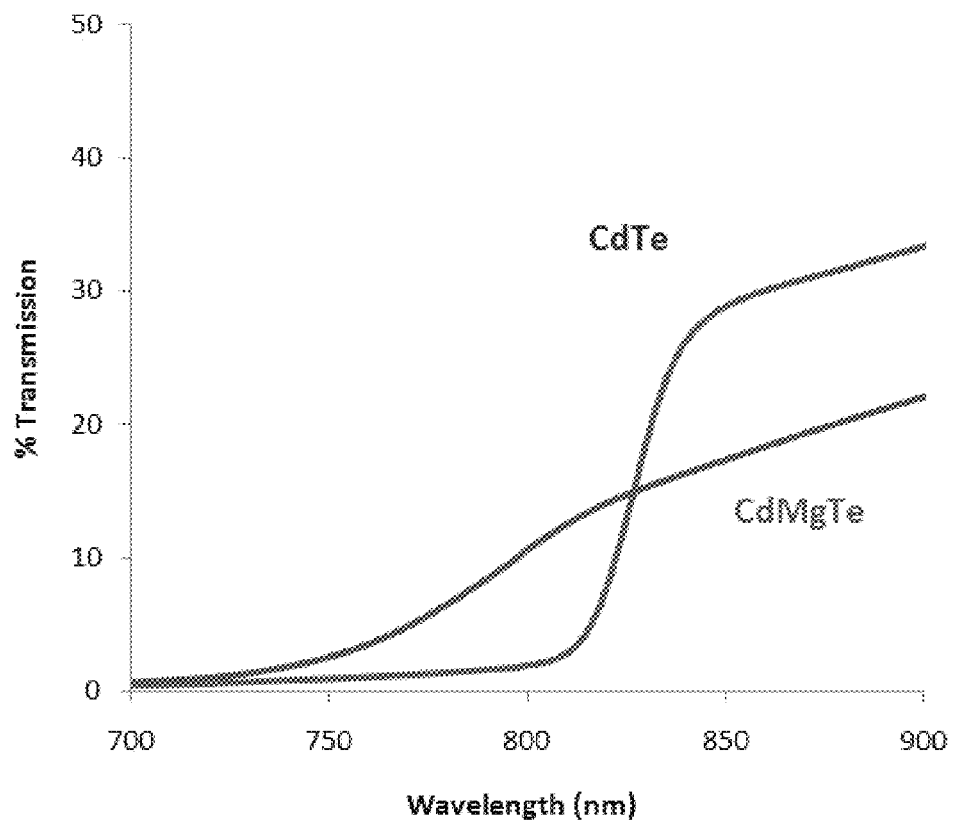
FIG. 2 is a graph of the transmission spectra obtained from CdTe and CdMgTe films produced using a prototype stacked-source sublimation system.

The optical properties of the CdTe layer and the $Cd_{1-x}Mg_xTe$ layer were analyzed using a commercially-obtained spectrophotometer. FIG. 2 is a graph summarizing the transmission spectra obtained for the two layers, using the transmission spectrum of air as a baseline. Comparing the CdTe spectrum to the CdMgTe spectrum shown in FIG. 2, a clear rise in material band gap was observed in these transmission data, indicating the formation of the higher band gap $Cd_{1-x}Mg_xTe$ film.

The results of these experiments demonstrated the feasibility of depositing a $Cd_{1-x}Mg_xTe$ thin film alloy using the prototype stacked source sublimation system. A growth rate of up to 1.0 µm/min was achieved using this prototype system.

Example 2

Optical Properties of $Cd_{1-x}Mg_xTe$ Thin Film Alloys of Varying Composition Deposited Using Prototype Stacked-Source Sublimation System To assess the optical properties of $Cd_{1-x}Mg_xTe$ thin film alloys of varying compositions formed using a prototype stacked source sublimation system under a variety of process conditions, the following experiments were performed.

The deposition of the $Cd_{1-x}Mg_xTe$ thin film alloys was performed using the prototype stacked source sublimation system described previously in Example 1. The prototype stacked source sublimation system was situated within a manufacturing system similar to the manufacturing system described previously herein and shown schematically in FIG. 3. A base pressure of below $10^{-5}$ Torr was accomplished using a diffusion pump outfitted with liquid nitrogen and water cold traps to prevent the inadvertent release of vapor products outside of the manufacturing system.

Glass/CdS substrates were formed prior to the current experiments by CSS deposition of CdS onto TEC 10 solar-grade glass (Pilkington North America, Inc.; Toledo, Ohio, USA). The $Cd_{1-x}Mg_xTe$ layers were deposited onto 3"×3" glass/CdS substrates in an atmosphere of 20-60 mTorr of Argon and at a substrate temperature of 450° C.-520° C. The CdTe source and Mg source temperatures were specified independently to control the growth rate and composition of the $Cd_{1-x}Mg_xTe$ alloy. The CdTe source temperatures were varied between 540° C. and 600° C. to control overall film growth rate. The Mg source temperature was varied between 380° C. and 520° C. to control the relative proportion of Mg in the composition of the alloy. Typically, the $Cd_{1-x}Mg_xTe$ films about 1 μm were deposited in about 2 minutes, corresponding to a deposition rate of about 500 nm/min.

Figure 4:
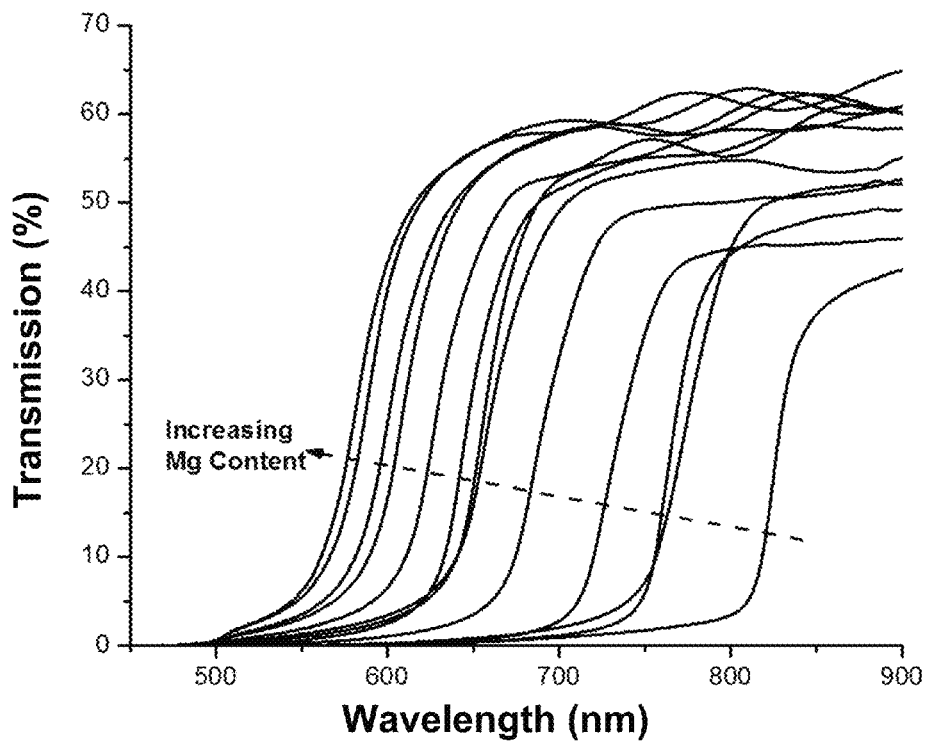
FIG. 4 is a graph of the transmission spectra obtained from CdMgTe films with varying Mg content produced using a prototype stacked-source sublimation system.

The optical properties of the $Cd_{1-x}Mg_xTe$ layers were analyzed using similar methods and equipment to those used in Example 1. FIG. 4 is a graph summarizing the transmission spectra obtained for numerous layers with various fractional Mg content. The spectra summarized in FIG. 4 indicated that $Cd_{1-x}Mg_xTe$ layers with a range of band gaps could be produced by manipulation of the process conditions of the prototype stacked source sublimation system.

The transmission spectra were used to calculate the band gap of the films using a standard Tauc plot method. In addition, each layer was subjected to planar Energy Dispersive X-ray Spectroscopy (EDS) using a field emission Scanning Electron Microscope (SEM) (model JSM-6500F; JEOL Ltd., Tokyo, Japan) to quantify the atomic concentration of Cd, Te, and Mg, as well as the ratio Mg/(Cd+Mg) for each layer.

Figure 5:
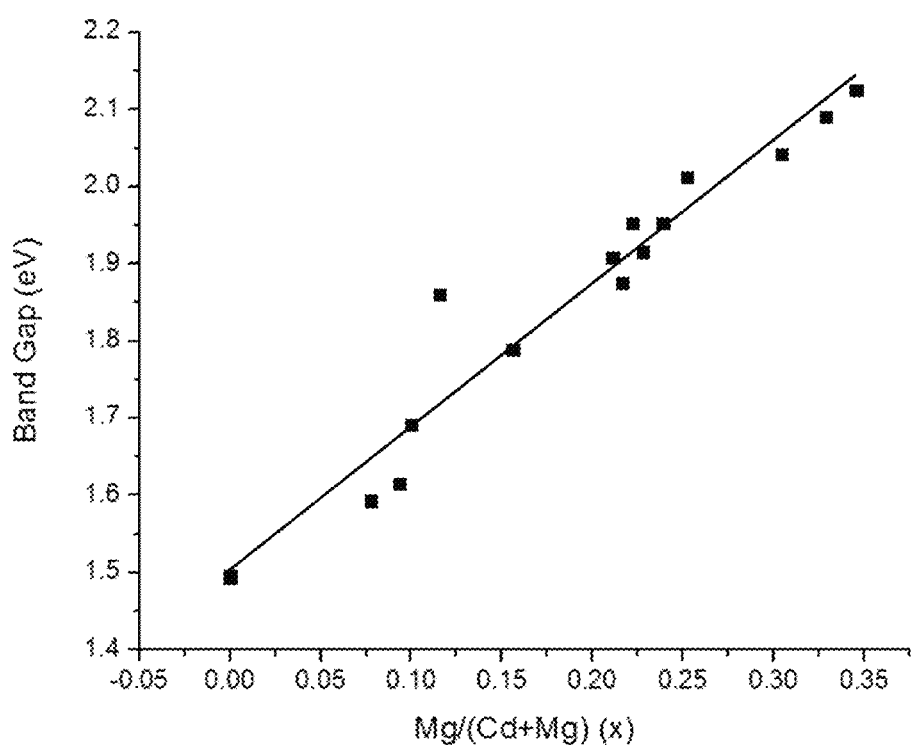
FIG. 5 is a graph summarizing the band gaps of $Cd_{1-x}Mg_xTe$ films with varying Mg content produced using a prototype stacked-source sublimation system.

The relationship between the Mg/(Cd+Mg) ratios and calculated band gaps of the layers is summarized in FIG. 5. A linear regression of the resulting data summarized in FIG. 5 had an $R^2$ value of greater than 0.95, indicating the layers films are of consistent quality. Further, the data and regression indicated a band gap of about 1.5 eV when Mg was absent from the layer (x=0). This value of 1.5 eV is consistent with the known band gap of similar untreated CdTe films.

The results of this experiment indicated that $Cd_{1-x}Mg_xTe$ thin film alloys with a range of band gaps could be reliably produced using the prototype stacked source sublimation system with controlled variation of process conditions.

Example 3

Crystallinity of $Cd_{1-x}Mg_xTe$ Thin Film Alloys of Varying Composition Deposited Using Prototype Stacked-Source Sublimation System To assess the layer crystalline structure of $Cd_{1-x}Mg_xTe$ thin film alloys of varying compositions formed using a prototype stacked source sublimation system under a variety of process conditions, the following experiments were performed.

Figure 6:
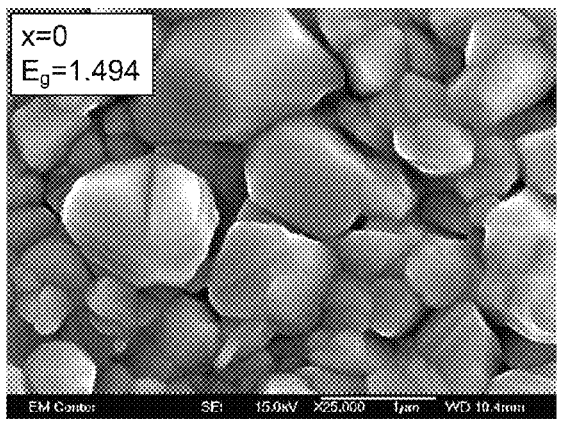
FIGS. 6A-C are scanning electron microscope (SEM) images of three $Cd_{1-x}Mg_xTe$ films produced using a prototype stacked-source sublimation system with varying Mg content, expressed as x=Mg/(Cd+Mg).
Figure 6:
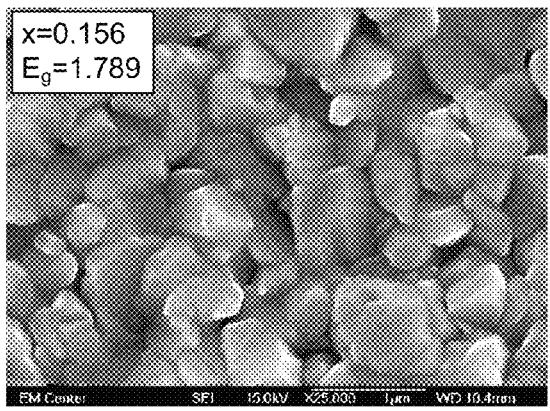
Figure 6:
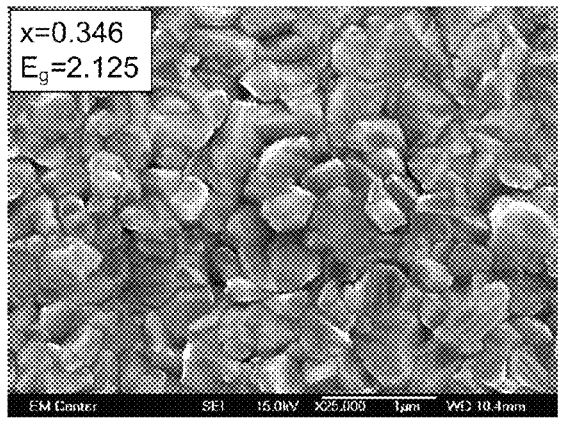

The $Cd_{1-x}Mg_xTe$ layers produced using the methods of Example 2 were further subjected to SEM imaging using the SEM microscope described in Example 3. FIGS. 6A-C are SEM images of selected $Cd_{1-x}Mg_xTe$ layers: a layer with x=0 and a band gap ($E_g$) of 1.494 (FIG. 6A); a layer with x=0.156 and $E_g$=1.789 (FIG. 6B); and a layer with x=0.0.346 and $E_g$=2.125 (FIG. 6C). The SEM images indicated a consistent pattern of change in layer crystallinity with increased Mg content. The crystal grain size decreased with increased Mg content in the layers. Additionally, the grains of the higher band gap films (higher Mg content) appeared to have more dislocations and structural defects compared to the layers with lower band gaps.

Figure 7:
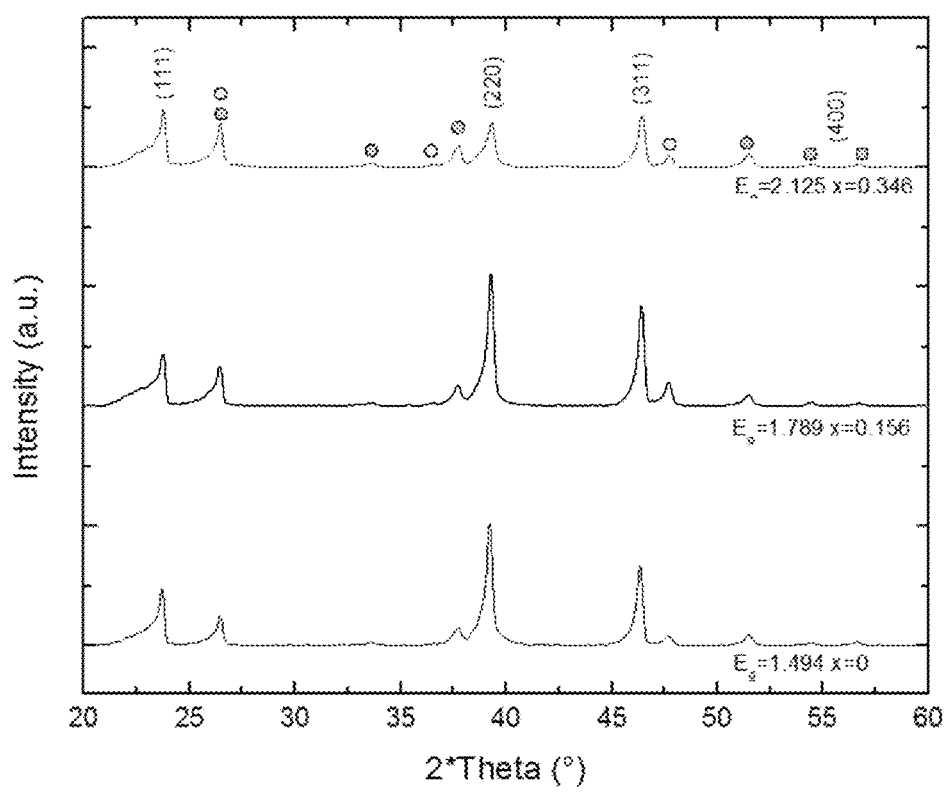
FIG. 7 is a graph summarizing the X-ray diffraction (XRD) spectra of the three $Cd_{1-x}Mg_xTe$ films shown in FIGS. 6A-C.

The $Cd_{1-x}Mg_xTe$ layers were also subjected to X-Ray Diffraction (XRD) measurements utilizing Cu Kα radiation (λ=1.5418 Å) (model D-8 Discover; BRUKER AXS, Inc., Madison, Wis., USA) to quantify grain orientation. The XRD spectra measured from the layers shown in FIGS. 6A-C are summarized in FIG. 7. For all layers the (111) peak had a broad shoulder at lower 2θ values, which is typically associated with intermixing between CdS and $Cd_{1-x}Mg_xTe$. This evidence of intermixing is likely due to the relatively high substrate temperature during deposition and low film thickness of less than 1 μm.

The results of these experiments indicated that as the concentration of Mg increased in the $Cd_{1-x}Mg_xTe$ layers produced using the prototype stacked source sublimation system, the crystal grain size decreased and the occurrence of dislocations and structural defects increased.

The foregoing merely illustrates the principles of the technology disclosed herein. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the disclosed technology and are thus within the spirit and scope of the disclosed technology. From the above description and drawings, it will be understood by those of ordinary skill in the art that the particular embodiments shown and described are for purposes of illustrations only and are not intended to limit the scope of the disclosed technology. References to details of particular embodiments are not intended to limit the scope of the disclosed technology.

What is claimed is:

1. A stacked-source sublimation system for the deposition of a complex thin-film alloy on a substrate, the system comprising:
    a first crucible containing a first source material, wherein the first crucible is operatively connected to a first heating element and defines a first heated pocket opening upward at a pocket opening;
    a second crucible containing a second source material, wherein the second crucible is operatively connected to a second heating element and defines a second heated pocket opening upward into a manifold comprising a plurality of conduits, and wherein the plurality of conduits connects the second heated pocket to the first heated pocket; and
    the substrate operatively connected to a third heating element situated vertically above the pocket opening;
    wherein the plurality of conduits is distributed uniformly over a bottom wall of the first heated pocket and each of the plurality of conduits extends vertically upward to connect the second heated pocket to the first heated pocket through the bottom wall.

2. The system of claim 1, wherein the second crucible is situated vertically below the first crucible.

3. The system of claim 1, wherein:
    the first heating element maintains the first heated pocket at a first temperature ranging from about 100° C. to about 1000° C., wherein the first temperature is above the sublimation temperature of the first source material;

the second heating element maintains the second heated pocket at a second temperature ranging from about 100° C. to about 1000° C., wherein the second temperature is above the sublimation temperature of the second source material; and the third heating element maintains the substrate at a third temperature ranging from about 100° C. to about 1000° C., wherein the third temperature is less than the first temperature.

4. The system of claim 3, wherein:

the first source material is a compound chosen from telluride compounds, sulfide compounds, chloride compounds, and selenide compounds; and the second source material is a metal or a compound chosen from telluride compounds, sulfide compounds, chloride compounds, and selenide compounds.

5. The system of claim 4, wherein:

the metal is chosen from Mg, Zn, Mn, Cu, Hg, Bi, Pb, and Cd;

the telluride compounds are chosen from CdTe;

the sulfide compounds are chosen from CdS; and the chloride compounds are chosen from $CdCl_2$, $CuCl_2$, and $MgCl_2$.

6. The system of claim 5, wherein:

the first source material consists of CdTe and the second source material consists of Mg;

the first temperature ranges from about 540° C. to about 620° C.;

the second temperature ranges from about 350° C. to about 520° C.; and the third temperature ranges from about 300° C. to about 550° C.

7. The system of claim 3, wherein a first flux of vaporized first source material from the first heated pocket is controlled by manipulating the first temperature of the first heated pocket.

8. The system of claim 3, wherein a second flux of vaporized second source material from the plurality of conduits is controlled by manipulating the second temperature of the second heated pocket.

9. The system of claim 8, wherein:

the second flux is controlled by a flux control element operatively connected to the manifold; and the flux control element is chosen from:

an adjustable shutter plate situated across each conduit cross section of the plurality of conduits, wherein the shutter plate occludes the plurality of conduits when adjusted to a closed shutter position and the shutter plate opens the plurality of conduits when adjusted to an open shutter position; and a plurality of adjustable valves operatively connected to the plurality of conduits of the manifold, wherein the plurality of valves occludes the plurality of conduits when adjusted to a closed valve position and the plurality of valves opens the plurality of conduits when adjusted to an open valve position.

10. The system of claim 1, wherein the substrate is situated above the pocket opening at a vertical separation distance of at least 1 μm.

11. The system of claim 1, wherein the system is situated within a vacuum device to maintain the system within an operational atmosphere at a pressure ranging from about 0.1 mTorr to about 100 mTorr.

* * * * *